United States Patent [19]

Newbold

[11] 4,281,299

[45] Jul. 28, 1981

[54] SIGNAL ISOLATOR

[75] Inventor: William F. Newbold, Philadelphia, Pa.

[73] Assignee: Honeywell Inc., Minneapolis, Minn.

[21] Appl. No.: 96,895

[22] Filed: Nov. 23, 1979

[51] Int. Cl.³ .................. H03H 9/00; H03H 9/13; H04R 17/00; H01L 41/04
[52] U.S. Cl. .................. 333/187; 310/314; 310/365; 332/2; 333/1; 333/133
[58] Field of Search .................. 333/186–192, 333/150–155, 24, 133, 1; 310/365–366, 334–337, 314–321; 364/821; 350/358; 330/10; 328/140–141, 221, 265; 331/107 A; 332/2

[56] References Cited

U.S. PATENT DOCUMENTS

| 3,483,476 | 12/1969 | Kobayashi et al. | 330/10 |
| 3,548,306 | 12/1970 | Whitehouse | 333/154 X |
| 3,848,144 | 11/1974 | Schissler | 333/154 X |

FOREIGN PATENT DOCUMENTS 1197860  7/1970  United Kingdom .................. 333/150

OTHER PUBLICATIONS

Peterson–"Acoustics, Fiber Optics Up Isolation Voltages", EDN, Nov. 20, 1978; pp. 66–67.

Primary Examiner—Marvin L. Nussbaum
Attorney, Agent, or Firm—Laurence J. Marhoefer; Lockwood D. Burton; Mitchell J. Halista

[57] ABSTRACT

A signal isolator has an acoustic transmitting medium with a first pair of acoustic transducers thereon for transmitting an input signal through the medium at a first frequency. A first transmitting and receiving circuit is used in combination with the first pair of transducers. A second pair of transducers is located on the acoustic medium to transmit a power supply signal through the medium at a second frequency. Power supply means associated with the power supply signals are used to energize the transmitting and receiving means on opposite sides of the medium.

8 Claims, 2 Drawing Figures

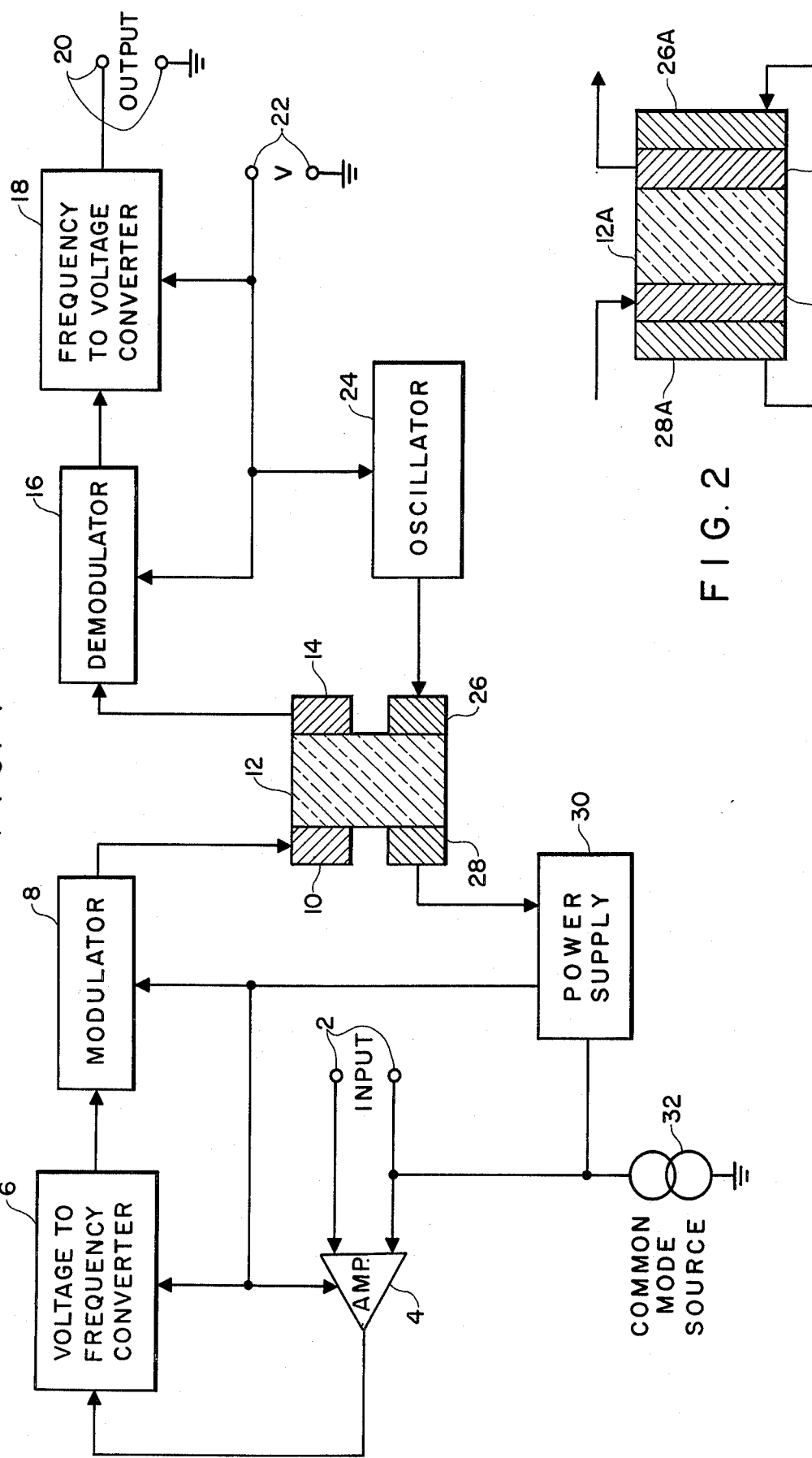

4,281,299

SIGNAL ISOLATOR

BACKGROUND OF THE INVENTION

1. Field of the Invention

The present invention relates to signal isolators. More specifically, the present invention is directed to a signal isolator using an acoustic coupling device.

SUMMARY OF THE INVENTION

An object of the present invention is to provide an improved signal isolator having power and input signal isolation using an acoustic coupling device.

In accomplishing this and other objects, there has been provided, in accordance with the present invention, a signal isolator having an acoustic medium, a first acoustic transducer means on the medium to transmit an input signal through the medium and a second acoustic transducer means on the medium to transmit a power supply driving signal through the medium and power supply means for energizing the first and second transducer means while maintaining electrical isolation between opposite sides of the acoustic medium.

BRIEF DESCRIPTION OF THE DRAWINGS

A better understanding of the present invention may be had when the following detailed description is read in connection with the accompanying drawings, in which:

FIG. 1 is a block diagram of an example of a signal isolator circuit embodying the present invention, and FIG. 2 is a cross sectional illustration of a modified acoustic transducer suitable for use with the isolator circuit shown in FIG. 1.

DESCRIPTION OF THE PREFERRED EMBODIMENT

Referring to FIG. 1 drawing in more detail, there is shown a block diagram of an example of a signal isolator circuit embodying the present invention and including a pair of input terminals 2 arranged to be connected to a source of input signal. The input terminals 2 are connected to the input of an amplifier 4 having an output connected to a voltage to frequency converter 6. The output of the voltage to frequency converter 6 is connected to the input of a modulator 8 suitable for driving an acoustic transducer 10. The acoustic transducer 10 is located on one side of an acoustic transmitter block 12 of an acoustically conductive medium concurrently providing electrical isolation, e.g., a ceramic or glass material.

On the other side of the acoustic block 12, a second acoustic transducer 14 is arranged to receive the acoustic signals from the transducer 10 and to apply the received signals to the input of a demodulator 16. The output of the demodulator 16 is connected to the input of a frequency to voltage converter 18. The output of the frequency to voltage converter 18 is connected to a pair of output terminals 20. A pair of power input terminals 22 are arranged to supply power to the demodulator 16, the frequency to voltage converter 18 and an oscillator 24. The output of the oscillator 24 is connected to a third acoustic transducer 26 located on the same side of the acoustic block 12 as the second transducer 12. A fourth acoustic transducer 28 is located on the other side of the acoustic block 12 from the third transducer 26 to receive the acoustic signals from the third acoustic transducer 26. The output signals from the fourth acoustic transducer 28 are applied to a power supply 30 to develop power supply signals for energizing the amplifier 4, the voltage to frequency converter 6 and the modulator 8. A common mode source 32 is connected to the common return line from one of the input terminals 2 and one side of the power supply 30 whereby power at the common mode voltage is introduced into the input circuit along with the input signal applied to the input terminals 2.

In operation, the signal isolator circuit shown in FIG. 1 is arranged to provide power to the acoustic isolator medium 12 from the oscillator 24 which the acoustic signal is used by the power supply 30 to produce power for powering the amplifier 4, the voltage frequency converter 6 and the modulator 8. Concurrently, the input signal which is applied to the input terminals 2 is arranged to produce a voltage output from the frequency converter 6 to operate the modulator 8 whereby a corresponding acoustic signal is passed through the acoustic medium 12 to the demodulator 16, the converter 18 and the output terminals 20. The power signal and the input signal circuit are arranged to operate at widely different frequencies through the acoustic medium, e.g., 100 kHz and 1 MHz. Consequently, the circuits connected to the transducers 10, 14, 26 and 28 are arranged to operate in the corresponding frequency ranges and to be relatively insensitive to acoustic and electrical signals outside of those ranges. Accordingly, the power signal is transmitted in a first direction through the acoustic medium and the input signal transmission is in the opposite direction through the acoustic medium with electrical and frequency isolation therebetween and between the transducers on one side of the acoustic medium 12 and the transducers on the other side of the acoustic medium 12. Inasmuch as this acoustic medium 12 is preferably an electrical insulator, the isolation therethrough protects the circuits on the input side from high voltage transients such as those occasioned by lighting strokes occurring on the output side.

In FIG. 2, there is shown an alternate embodiment of the acoustic isolator wherein the transducers are arranged in a layered form on an acoustic transmitting medium. Reference characters similar to those found in FIG. 1 have been used for the structural elements shown in FIG. 2 with the addition of the letter "A" following these numbers to indicate the alternate embodiment. Thus, the acoustic medium 12a is arranged to have on one side thereof a first layer forming a first acoustic transducer 10a and a second layer on the opposite side forming a second acoustic transducer 14a. A third layer 26a is provided on the second layer 14a to form the third transducer 26a and a fourth layer is arranged on the first layer 10a to form the fourth transducer 28a. The operation of the acoustic isolator element shown in FIG. 2 is the same as that group described above for FIG. 1 with the exception that the acoustic signals from the outside transducers pass through the inner transducers before reaching the acoustic isolator medium 12a.

It should be noted that while the signal isolator of the present invention has been presented in examples utilizing two pairs of acoustic transducers, a single pair of acoustic transducers could be utilized with the reverse transmission of the input data signal from the data input to the data output of the isolator circuit being achieved by a secondary pulsing, or wave distorting, of the power supply signal already being transmitted through the acoustic medium. In this arrangement, the secondary pulsing would be at a different, i.e., lower frequency than the power supply signal transmission and would be effectively transmitted back through the medium for detection on the output side of the acoustic medium by a receiving circuit responsive to the lower frequency data signal. Thus, the transmitting of the power supply signal and the data signal could be achieved with one pair of acoustic transducers on the acoustic medium with the effective reverse transmission of the data signal appearing on the output side of the signal isolator circuit as a deliberate change in the power supply waveshape. Consequently, the pair of acoustic transducers in this example of another alternate embodiment of the present invention would continue to transmit the power supply signal through the acoustic medium while the effect of the data transmission from the input side would be detected on the output side of the signal isolator.

Accordingly, it may be see that there has been provided, in accordance with the present invention, an improved isolation circuit for providing an input signal and power supply isolation between input and output circuits.

The embodiments of the invention in which an exclusive property or privilege is claimed are defined as follows:

1. A signal isolator circuit comprising:
   an acoustic medium having electrical insulation properties and acoutsic transmission properties,
   a first acoustic transducer on said acoustic medium,
   input means for applying an input signal to the isolator circuit to energize said first acoustic transducer to produce corresponding acoustic signals in said medium,
   a second acoustic transducer on said medium arranged to receive acoustic signals from at least said first transducer and to produce electrical output signals representative thereof,
   output means for receiving output signals from said second transducer and for responding to said output signals representative of acoustic signals from said first transducer,
   a third acoustic transducer located on said acoustic medium,
   power signal means for energizing said third transducer to produce corresponding acoustic signals in said medium,
   a fourth acoustic transducer located on said acoustic medium and arranged to receive acoustic signals from at least said third transducer and to produce electrical output signals representative thereof,
   power supply means connected to said fourth transducer and arranged to develop power supply signals for said input means in response to said output signals from said fourth transducer representative of acoustic signals from said third transducer.

2. An isolator as set forth in claim 1 wherein said first and second transducers are located on opposite sides of said acoustic medium and said third and fourth transducers are located on opposite sides of said acoustic medium and spaced from said first and second transducers.

3. An isolator circuit as set forth in claim 2 wherein said first and second transducers operate on a frequency of 100 kHz and said third and fourth transducers operate on a frequency of 1 MHz.

4. An isolator circuit as set forth in claim 1 wherein said input means includes a voltage to frequency coverter arranged to convert said input signal to a corresponding frequency signal and a modulator means for applying said frequency signal to energize said first transducer and said output circuit includes a demodulator means arranged to receive electrical output signals from second transducer and a frequency to voltage converter arranged to convert output signals from said demodulator means to a corresponding voltage representative of said input signal.

5. An isolator circuit as set forth in claim 4 wherein said power signal means includes an oscillator means arranged to energize said third transducer, said demodulator means and said frequency to voltage converter and said power supply means includes means for developing said power supply signal for said voltage to frequency converter and said modulator means.

6. An isolator circuit as set forth in claim 1 wherein said first and second transducers are arranged as layers on said acoustic medium and said third and fourth transducers are arranged as layers on top on said first and second transducers.

7. An isolator comprising comprising
   an acoustic medium having electrical insulation properties and acoustic transmission properties,
   first acoustic signal transmitting means for transmitting a first acoustic signal at a first frequency through said medium,
   first receiving means for detecting said first acoustic signal and for developing a corresponding first electrical signal,
   second acoustic signal transmitting means located on the opposite side of said acoustic medium from said first acoustic signal transmitting means for transmitting a second acoustic signal at a second frequency different from said first frequency through said medium, and
   second receiving means for detecting said second acoustic signal and for developing a corresponding second electrical signal,
   wherein said first receiving means includes a power supply means energized by said first acoustic signal to produce said first electrical signal as a power supply output signal and said second transmitting means includes means for producing said second acoustic signal to represent input data signals to the isolator circuit to be transmitted through said acoustic medium and said second electrical signal is representative of said data signals.

8. An isolator circuit as set forth in claim 7 wherein said first frequency is 100 kHz and said second frequency is 1 MHz.

* * * * *